United States Patent
Chen

(10) Patent No.: US 8,491,067 B2
(45) Date of Patent: Jul. 23, 2013

(54) SUPPORT DEVICE FOR ELECTRONIC DEVICE

(75) Inventor: Yun-Lung Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 379 days.

(21) Appl. No.: 12/903,086

(22) Filed: Oct. 12, 2010

(65) Prior Publication Data

US 2011/0316398 A1    Dec. 29, 2011

(30) Foreign Application Priority Data

Jun. 25, 2010   (CN) .......................... 2010 1 0209998

(51) Int. Cl.
*A47B 97/00* (2006.01)
*A47B 91/00* (2006.01)

(52) U.S. Cl.
USPC .................. 312/223.2; 312/351.1; 248/188.8; 248/677

(58) Field of Classification Search
USPC ....... 312/7.2, 223.1, 223.2, 351.1; 248/188.1, 248/188.8, 188.9, 615, 677; 16/42 R; 361/679.01, 679.02, 679.59
See application file for complete search history.

(56) References Cited

U.S. PATENT DOCUMENTS

| | | | | |
|---|---|---|---|---|
| 2,849,201 A | * | 8/1958 | Schelgunov | 248/615 |
| 2,886,918 A | * | 5/1959 | Bayley et al. | 248/188.9 |
| 4,243,194 A | * | 1/1981 | Moore et al. | 248/188.1 |
| 5,169,115 A | * | 12/1992 | Chung Hsiang | 248/677 |
| 5,688,030 A | * | 11/1997 | McAnally et al. | 312/223.2 |
| 5,957,420 A | * | 9/1999 | Wang | 248/188.8 |
| 6,439,519 B1 | * | 8/2002 | Takamasa | 248/188.8 |
| 7,095,610 B1 | * | 8/2006 | Banko | 361/679.55 |
| 2007/0246638 A1 | * | 10/2007 | Idehara et al. | 248/677 |
| 2008/0029664 A1 | * | 2/2008 | Hsu | 248/188.8 |
| 2011/0102981 A1 | * | 5/2011 | Chen | 361/679.01 |

* cited by examiner

*Primary Examiner* — James O Hansen
(74) *Attorney, Agent, or Firm* — Altis Law Group, Inc.

(57) ABSTRACT

An electronic device includes an enclosure and a support device. The enclosure includes a securing portion. At least two securing holes are defined in the enclosure. The support device is fixed to the enclosure. The support device includes a protective pad and at least two elastic securing feet. The protective pad is fixed to an outer surface of the enclosure. The at least two elastic securing feet radially extend from the protective pad. Each of the elastic securing feet includes a block portion and a catch portion. The securing feet extend through the securing holes respectively from the outer surface of the enclosure to an inner surface of the enclosure. Each block portion abuts the inner surface of the enclosure. Each catch portion is elastically clasped to the securing portion of the enclosure.

2 Claims, 8 Drawing Sheets

SUPPORT DEVICE FOR ELECTRONIC DEVICE

BACKGROUND

1. Technical Field

The disclosure relates to a support device for use with an electronic device.

2. Description of Related Art

Electronic devices, such as computers, usually have supports, such as padded legs for keeping electronic devices out of direct contact with surfaces such as a desktop to prevent the electronic devices from being scraped. Typically, the supports are made of plastic, rubber etc and attached to the enclosures of the electronic devices by glue. However, these kind of typical supports are not very durable and easily detached from the enclosures.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
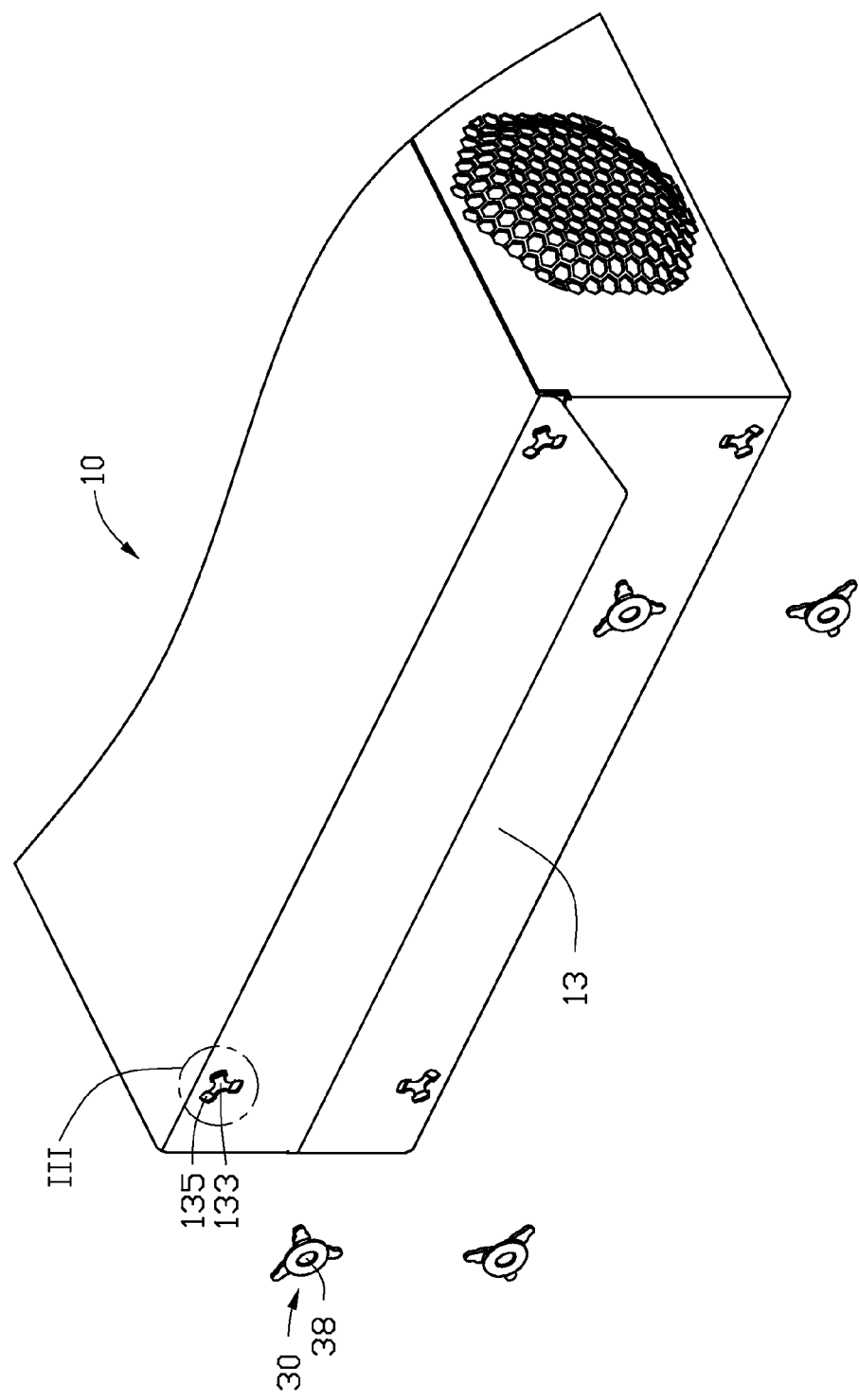
FIG. 1 is a partial, exploded, and isometric view of an electronic device according to an embodiment.
Figure 2:
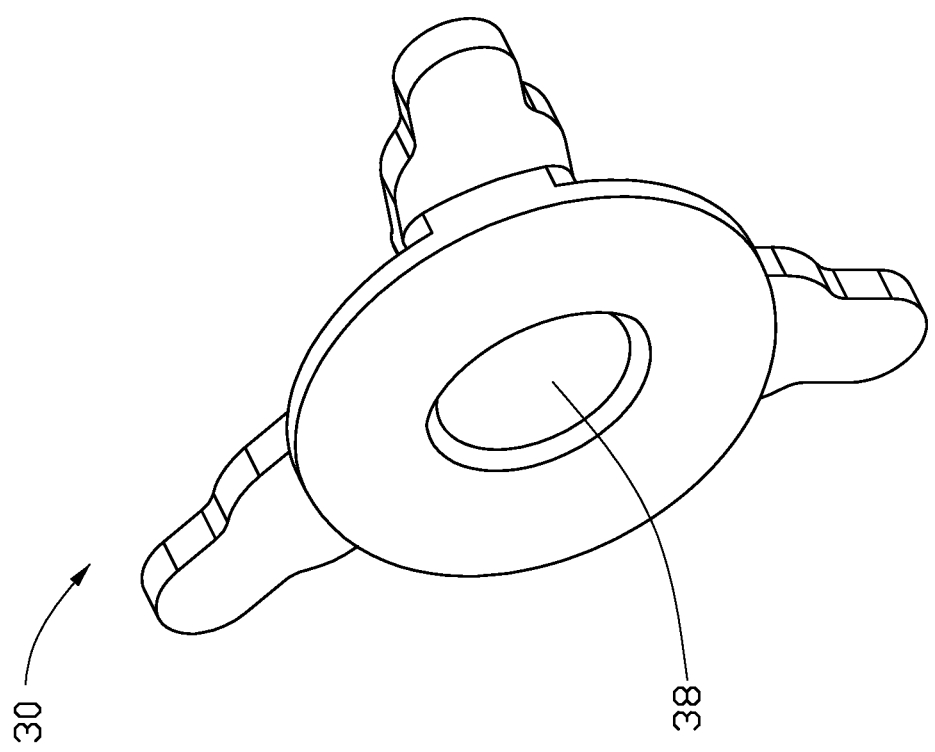
FIG. 2 is an isometric view of a support device of FIG. 1.
Figure 3:
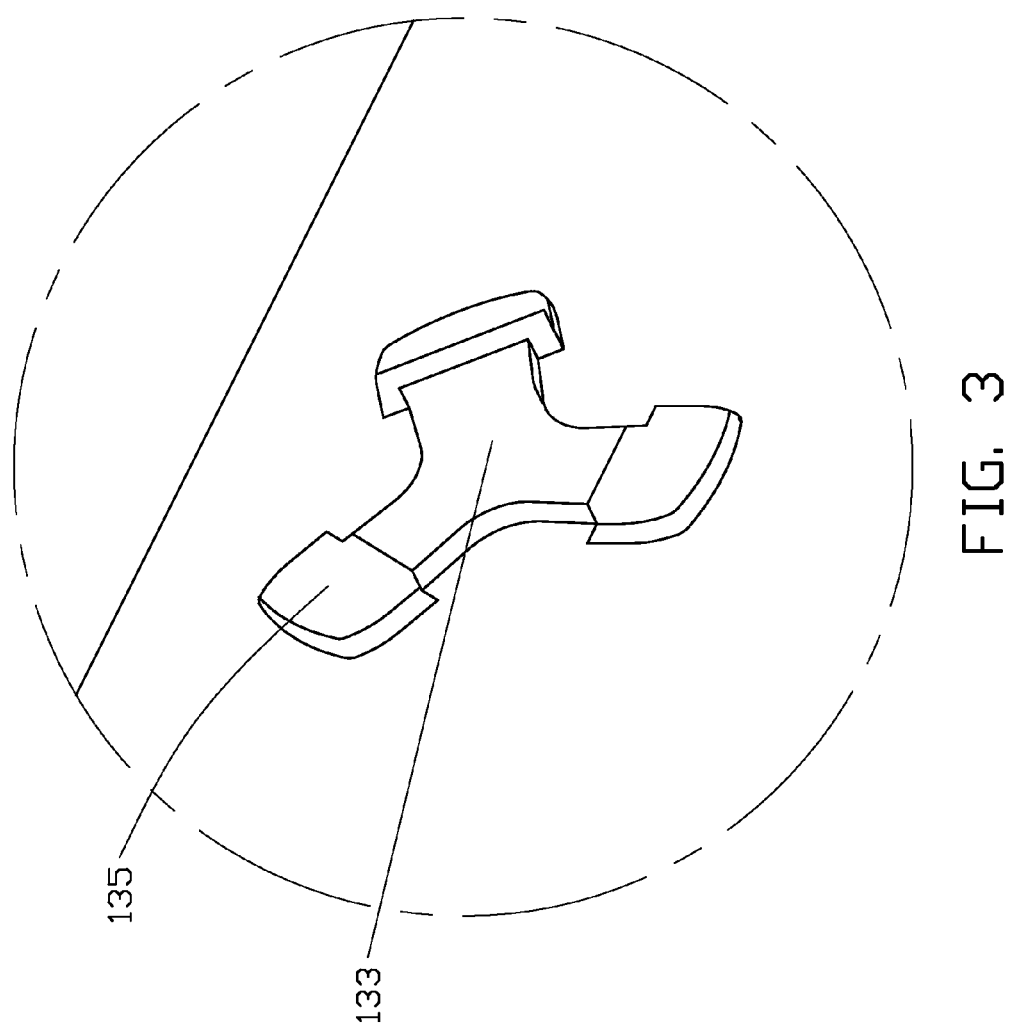
FIG. 3 is an enlarged view of encircled portion III of FIG. 1.
Figure 4:
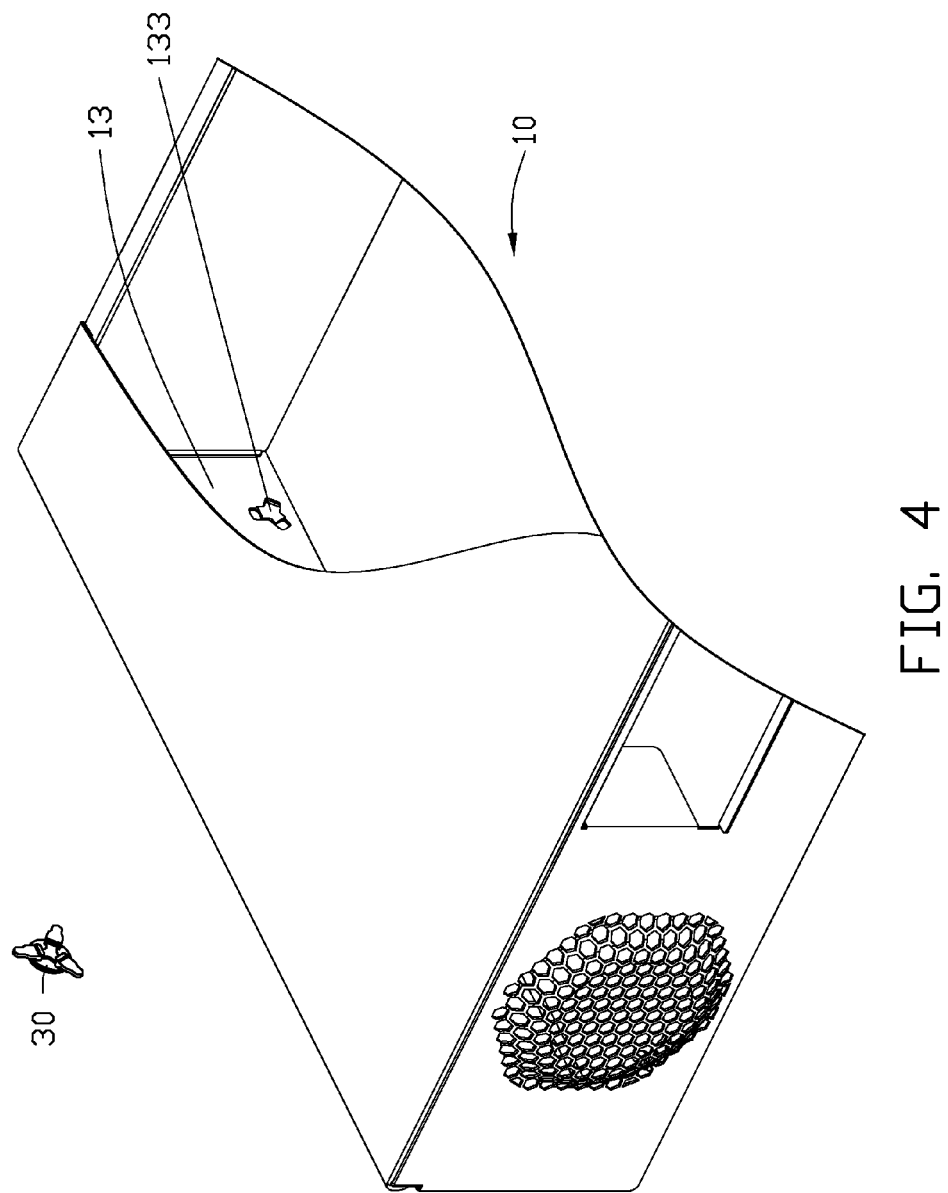
FIG. 4 is similar to FIG. 1, but shown in another aspect.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIGS. 1-4, in one embodiment, an electronic device includes an enclosure 10 and at least two support devices 30 fixed to a bottom wall 13 of the enclosure 10. In one embodiment, four support devices 30 are employed. The electronic device can be a desktop computer, or a server.

In one embodiment, the bottom wall 13 has four securing portions 133. Three securing holes 135 are defined in the bottom wall 13 adjacent to each securing portion 133. The bottom wall 13 has an inner surface and an outer surface. Each securing portion 133 is recessed from the outer surface into the inner surface of the bottom wall 13. Each securing portion 133 is Y-shaped. The securing portions 133 are punch formed in the bottom wall 13. The three securing holes 135 are defined at the end of each securing portion 133.

Figure 5:
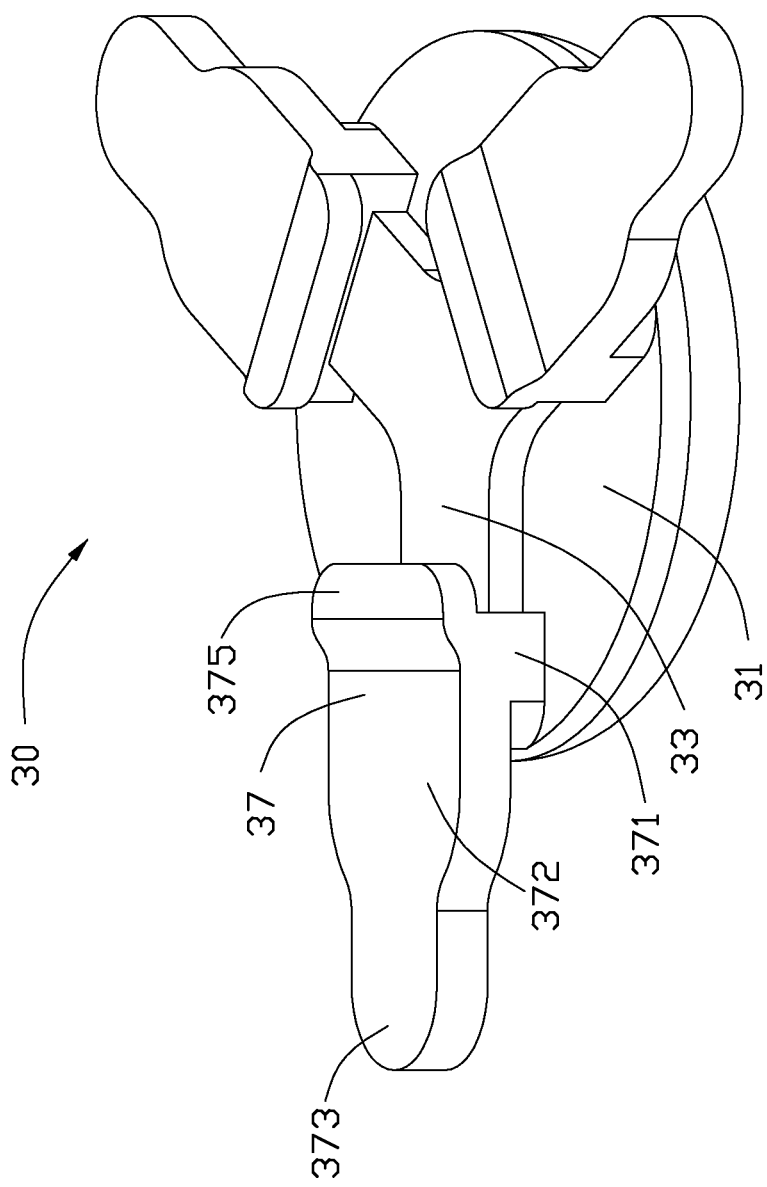
FIG. 5 is another isometric view of the support device of FIG. 1.

Referring to FIG. 5, in one embodiment, each supporting device 30 includes a protective pad 31, a ridge 33 protruding from an inner surface of the protective pad 31 and three elastic securing feet 37.

The protective pad 31 may be circular, ellipse, or rectangular, and the protective pad 31 may be made of rubber, plastic, combine of rubber and plastic, or other proper flexible shock absorbing material. In one embodiment, a recess 38 is defined in an outer surface of the protective pad 31 to increase friction of the protective pad 31. In other embodiments, the protective pad 31 may have frictional surface in other shape, such as wave surface.

The three securing feet 37 radially extend from the inner surface of the protective pad 31. The extension directions of the three securing feet 37 are substantially parallel to the bottom wall 13 of the enclosure 10. An angle between the extension directions of every two securing feet 37 is substantially 60 degrees. Each of the three securing feet 37 includes a connecting portion 371, a block portion 372, a guiding portion 373, and a portion 375. Each guiding portion 373 extends from an end of the block portion 372 and may have a rounded distal end. A width of each guiding portion 373 is less than that of each block portion 372. Each catch portion 375 and each block portion 372 substantially extend in opposite directions. Each catch portion 375 protrudes from a plane of each block portion 372. Each securing feet 37 can elastically move about each connecting portion 371.

Figure 6:
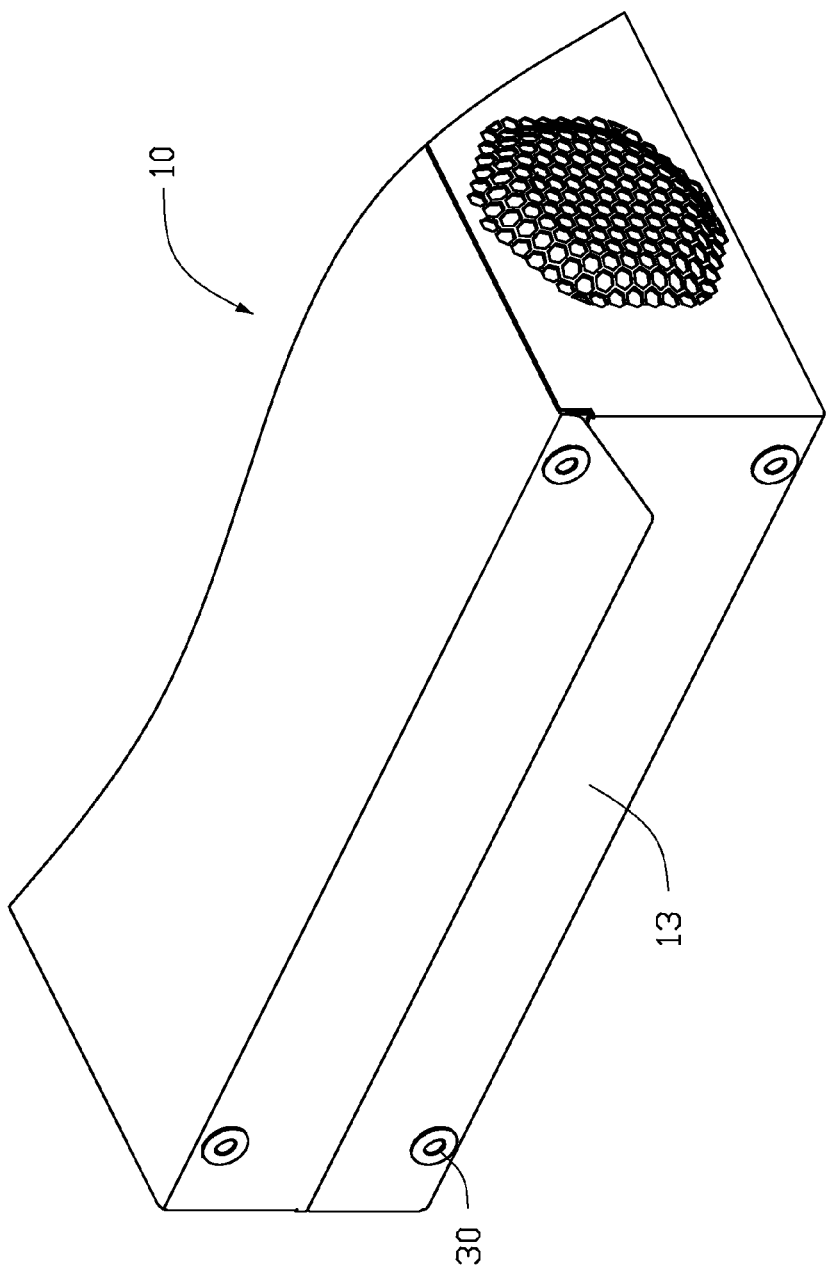
FIG. 6 is an assembled view of FIG. 1.
Figure 7:
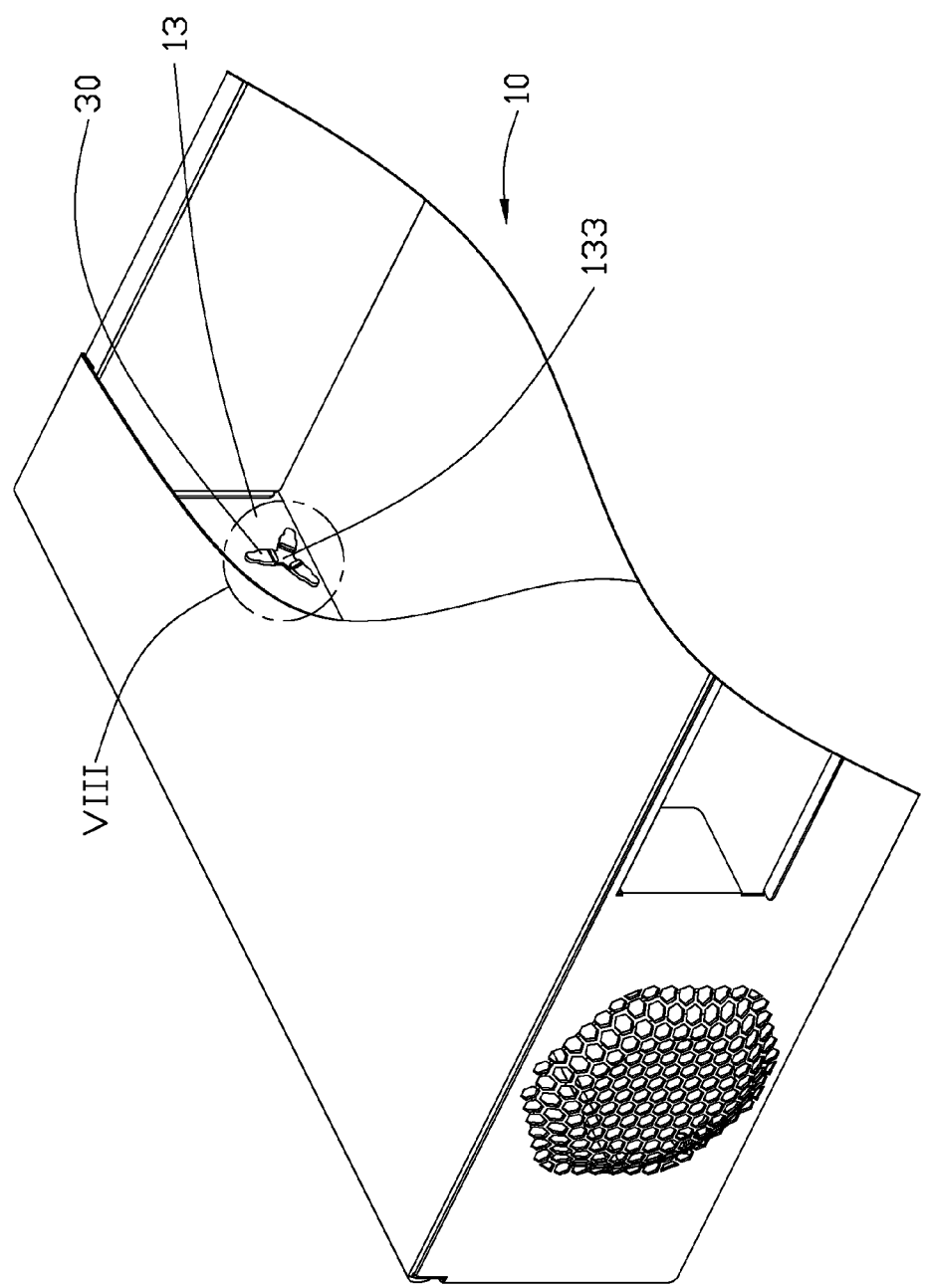
FIG. 7 is an assembled view of FIG. 2.
Figure 8:
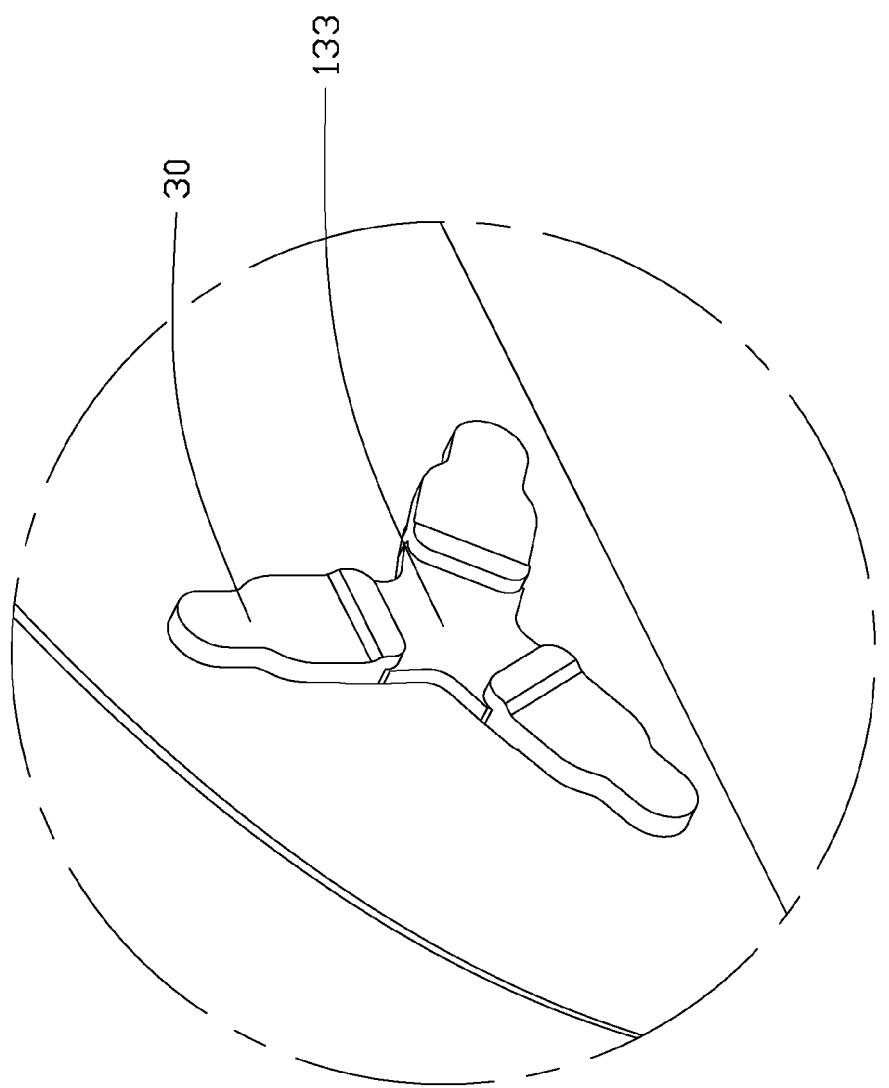
FIG. 8 is an enlarged view of encircled portion VIII of FIG. 7.

Referring to FIGS. 6-8, during assembly of the electronic device, each catch portion 375 is pressed inward to elastically lift up each guiding portion 373 and each block portion 372. The three securing feet 37 respectively extend into the three securing holes 135 of the enclosure 10. Each catch portion 375 is released, and each block portion 372 rebounds and abuts against the inner surface of the bottom wall 13. The support device 30 then is pressed towards the bottom wall 13. Each catch portion 375 deforms back and moves over the securing portion 133 of the bottom wall 13. When each catch portion 375 is located on an inner surface of the securing portion 133, the support device 30 is fixed to the bottom wall 13. At this time, each catch portion 375 is clasped to the securing portion 133, and the securing portion 133 is located between the three catch portions 375 and the ridge 33. The other support devices 30 are fixed to the bottom wall 13 in the same way.

During disassembly of the support device 30, each catch portion 375 is pressed inward to disengage from the securing portion 133. The protective pad 31 is then pulled away from the bottom wall 13, and the each guiding portion 373 and each block portion 372 are elastically deformed. The support device 30 then is removed from the bottom wall 13.

Each supporting device 30 may include at least two securing feet, so at least two securing holes 135 may be defined in each securing portion 133 corresponding to the at least two securing holes 135. In another embodiment, the bottom wall 13 of the enclosure 10 has two securing feet. The two securing feet extend in opposite directions in order to firmly secure the supporting device 30.

It is also to be understood, however, that even though numerous characteristics and advantages have been set forth in the foregoing description of preferred embodiments, together with details of the structures and functions of the preferred embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
an enclosure comprising a securing portion, and three securing holes defined in the enclosure; and a support device fixed to the enclosure, the support device comprising:
  a protective pad fixed to an outer surface of the enclosure; and
  three elastic securing feet radially extending from the protective pad, each of the three elastic securing feet comprising a block portion and a catch portion;
wherein the three elastic securing feet extend through the three securing holes respectively from the outer surface of the enclosure into an inner surface of the enclosure, each block portion abuts the inner surface of the enclosure, and each catch portion is elastically clasped to the securing portion of the enclosure; each of the three elastic securing feet further comprise a guiding portion extending from an end of each of the three block portions, each guiding portion has a rounded distal end, and a width of each of the three guiding portions is less than that of each of the three block portions.

2. A support device fixed to an enclosure of an electronic device, the support device comprising:
  a protective pad fixed to an outer surface of the enclosure; and
  at least two elastic securing feet radially extending from the protective pad, each of the at least two elastic securing feet comprising a connecting portion, a block portion and a catch portion, the connecting portion located between the protective pad, and the block portion and the catch portion;
wherein the at least two elastic securing feet are configured to elastically move about the connecting portion the at least two elastic securing feet extend through the enclosure from the outer surface of the enclosure into an inner surface of the enclosure, each block portion abuts the inner surface of the enclosure, and each catch portion is elastically clasped to the enclosure, each of the at least two elastic securing feet further comprises a guiding portion extending from an end of each of the at least two block portions, each guiding portion has a rounded distal end, and a width of each of the two guiding portions is less than that of each of the at least two block portions.

* * * * *